United States Patent [19]

Flock et al.

[11] 3,876,460

[45] Apr. 8, 1975

[54] FINE-LINE THICK-FILM SUBSTRATE FABRICATION

[75] Inventors: William M. Flock, Doylestown, Pa.; Lawrence F. Cochran, Pittstown, N.J.

[73] Assignee: Plessey Incorporated, New York, N.Y.

[22] Filed: Jan. 24, 1974

[21] Appl. No.: 436,066

[52] U.S. Cl. .................. 117/212; 117/213; 117/227

[51] Int. Cl. .................. B44d 1/18

[58] Field of Search .......... 117/212, 213, 229, 227; 252/512, 514, 518

[56] References Cited

UNITED STATES PATENTS 3,497,384 2/1970 Pirigyi .................. 117/212

3,661,635 5/1972 Harrison .................. 117/212

*Primary Examiner*—John D. Welsh

*Attorney, Agent, or Firm*—James J. Burke

[57] ABSTRACT

Ceramic substrates having screened and plated conductive lines 3 mils wide with 3 mil spacing are reliably produced by screening onto calcined but not sintered substrates, allowance being made for subsequent shrinkage on sintering to the fully cured state. In addition to better line definition, the process is simpler and more economic than methods currently employed.

16 Claims, 1 Drawing Figure

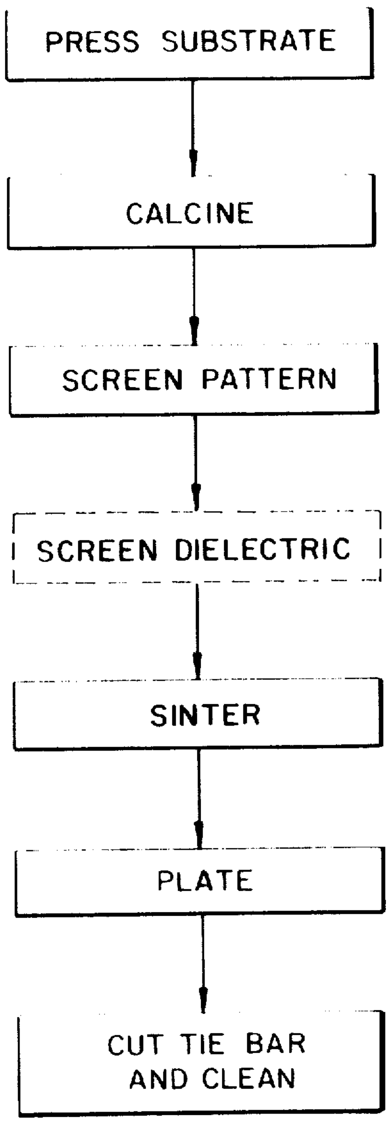
PRESS SUBSTRATE
CALCINE
SCREEN PATTERN
SCREEN DIELECTRIC
SINTER
PLATE
CUT TIE BAR
AND CLEAN

FINE-LINE THICK-FILM SUBSTRATE FABRICATION

BACKGROUND OF THE INVENTION

The present invention relates in general to ceramic substrates utilized to package semiconductive devices or elements. More particularly, it relates to a high-volume, low-cost process for reliably screening metallic conductor patterns onto ceramic substrates with better line definition than has heretofore been possible.

The development of large-scale integrated circuits and, particularly, beam lead devices has created many problems for the manufacturer of packages for such devices, due largely to their extremely small size. Devices having 5 mil leads with 5 mil spacing are state-of-the-art, and 2 mil leads with 2 mil spacing are said to be obtainable. Producing a substrate on which such devices can be mounted and packaged in electrical contact with a metallized and plated lead patterns has pushed conventional screening procedures to their virtual limits, and even under the best conditions reject rates are high.

These procedures, well-known in the art, can be briefly summarized as follows: The substrates are generally made of high-alumina ceramics but in some instances beryllia, barium titanate or other ceramic materials are employed. The substrates are either pressed from powder or stamped from a green tape, with dimensions that take into account the shrinkage that will occur on firing (roughly, about 16–22% larger than the desired final size for alumina). Sintering at 1400°–1700°C. follows, and the now fully cured ceramic is ground to suitable flatness (± 2 mils is typical) and cleaned. The metallizing paste, the compositions of which are varied and well known, are applied in the desired pattern by transfer techniques such as silk screening. A second sintering follows, on this occasion in a reducing atmosphere so as not to oxidize the metal pattern. Plating of the pattern follows, generally with nickel and/or gold. The tie bar connecting all the leads (to facilitate plating) is then removed. If a dielectric layer is required to cover the pattern except at the lead ends, this is screened and fired, and the part is finished.

The screening of 3 to 5 mil lines with 3 to 5 mil spacing onto cured ceramics is difficult at best, and virtually impossible on large substrates. Very fine lines require very thin coatings, which necessitate less-viscous pastes, but the thinner the paste the poorer the line definition, i.e. the more the pattern will bleed out during application or drying. Further, the non-porous, dense surface of the fired ceramic tends to reduce line definition because the screened paste can only move horizontally across the surface. Lastly and perhaps most significantly, the dimensional tolerances of fired ceramics are ± 1% (due mainly to shrinkage variations), and alignment of the pattern must be held within ± 0.002 in. This is not possible for parts greater than about one-half inch in length.

The foregoing difficulties have led workers in the art to utilize photo-etching techniques, which are well known to have fine line capabilities of the type required. However, the etching of metallized and plated patterns on ceramics presents problems of its own, principally because of the high degree of insolubility of the metallized layer in etchants used to patternform the plated layer. The result is diffused, ragged lines having poor adhesion.

OBJECTS OF THE INVENTION

A general object of the present invention is to provide an improved method of producing fine-line conductive patterns on ceramic substrates.

A further object of the present invention is to provide a high-volume, low-cost and reliable method of producing ceramic substrates with fine-line patterns.

Another object of the present invention is to provide a method of screening fine-line patterns on ceramic substrates which is simpler and more economic than previously known methods.

A still further object of the present invention is to provide a method of producing a fine-lined ceramic substrate including a monolithic, co-fired dielectric overcoat.

Various other objects and advantages of the invention will become clear from the following description of embodiments thereof, and the novel features will be particularly pointed out in connection with the appended claims.

THE DRAWINGS

Reference will hereinafter be made to the single accompanying drawing, which is a simplified flow diagram or flow sheet illustrating steps involved in carrying out the invention.

DESCRIPTION OF EMBODIMENTS

In essence the present invention is based, at least in part, on the discovery that improved line definition is achieved by screening the pattern onto a calcined but not sintered substrate. The improvement is two-fold. First, because the calcined substrate is relatively porous, the paste retains better line definition during subsequent drying and firing. It is believed that the paste tends to migrate into the pores rather than across the surface. Second, because in the calcined state the substrate is still essentially in its as-pressed (or unshrunken) size, both the pattern and the spacing, as screened, are significantly larger than the final size, making both the screening and meeting of required tolerances a great deal easier. As a typical example, production of a final product having 5 mil lines and 5 mil spaces is achieved by screening 7 mil lines with 7 mil spaces. The 16–22% shrinkage which occurs upon subsequent firing brings both the substrate and the pattern into final specification. Alignment specifications are easier to meet because the pressed and calcined substrate can be held to ± 0.001 in. without problem (the ± 1% on fired parts is due to shrinkage variations), and the calcined part is larger by about 20% than the fired part.

The process of the invention is illustrated in simplified, graphic form in the attached drawing and is discussed hereinbelow.

Pressing (or stamping) of the substrate is entirely conventional and need not be described in detail. It is to be noted that since the overall shrinkage which the substrate will undergo during processing is the same as during conventional processing, the size of as-formed substrates used in carrying out the invention is also conventional.

Calcining of the substrates follows. This is an important step in carrying out the invention and is foreign to conventional processing. In particular, the substrate is heated to a temperature sufficient to form a monolithic but porous and un-shrunken part, but one from which all binders have been driven off. Specific times and temperatures for calcining will vary with the size and thickness of the substrate, and with available furnaces and how the parts are stacked in the furnace. In any event, calcining should be so intense as to cause any appreciable shrinkage, about 1% at the most. The calcined part will have a matte finish, as distinguished from the near semi-gloss finish of fully fired (and densified) ceramics. The matte finish is of course indicative of porosity.

Typically, an alumina substrate measuring 0.25 to 3.0 inches is properly calcined at a temperature in the range of 850° to 1200°C. when a single layer is charged to the furnace, and calcining is carried out for 60 to 180 minutes. If the parts are packed together on edge in order to increase furnace capacity, however, the minimum calcining time is increased to 120 minutes. However, the important criteria in determining calcining conditions are retention of porosity and prevention of shrinkage. As there is no printing on the substrate, calcining is carried out in air, as in conventional firing.

The calcined substrate can be handled readily, indeed it is handled just as easily as fully fired parts. More important, it has been determined that calcined substrates retain the flatness and dimensional tolerances of the green parts, and so the surface grinding required of fully fired parts is not required in carrying out the invention.

Metallizing of the substrate in the desired lead pattern follows. This step is conventional, except insofar as the pattern lines and spaces on the screen are proportionately larger, so as to accomodate for subsequent shrinkage. Conventional pastes, such as molybdenum-manganese or molybdenum-titanium are employed.

In accordance with the present invention, it is possible to apply a dielectric overcoat directly over the unfired lead pattern after only air drying of the pattern, and to then co-fire both layers while at the same time fully curing the ceramic substrate. Thus, whereas conventional processing requires three separate firings, i.e. one each for the substrate, lead pattern and dielectric, the present invention requires only one calcining and one firing.

Application of the dielectric as described above requires that it be a screen-printable ceramic paste amenable to such treatment. For an alumina substrate, an alumina paste would obviously be preferred. As dielectric coatings are not universally required, and as other dielectrics are known which would require separate processing, screening of the dielectric is shown in the drawing in phantom, as an optional step.

The use of a dielectric paste having the same composition as the substrate offers several advantages: Thermal stressing between dielectric and substrate is eliminated; the coating and substrate have the same electrical and mechanical properties; and, since the dielectric layer is also a porous ceramic, it can also be used as a substrate for additional screened patterns, thus giving the process of the invention capabilities in producing multi-level composite substrates. Additionally, the dielectric coating protects the fine line pattern of metallization. Plating is very sensitive to surface impurities, which can cause plating over-growth or bridging between lines, and immediate application of a dielectric prevents this from becoming a problem.

Sintering of the printed and coated substrate follows. This is carried out at a temperature that will fully cure and densify the ceramic, which will be more than adequate to also fire the conductive and dielectric layers, generally 1400° to 1700°C. As would be expected, this must be carried out in a reducing atmosphere, typically dissociated ammonia or forming gas, to avoid oxidation of the conductive. The time necessary for sintering will again depend on the type of part and how it is loaded into the furnace. For the same part as referred to hereinabove, sintering is as follows:

Flat array

Temperature: 1400° to 1700°C.
Time: 5 to 10 hours

Edge-packed array

Temperature: 1475° to 1700°C.
Time: 7 to 10 hours

The sintered substrates are then plated, following conventional procedures. The parts are mounted on a plating rack and plated with desired thicknesses of gold, nickel-gold or whatever is desired. It will be noted that where the dielectric overcoat covers all but the ends of the conductive pattern the amount of metal plated will be substantially reduced, a not insignificant matter at current precious metal prices. Since the gold is there to provide bonding or contact surfaces, the completed substrate does not suffer in any way.

The use of a tie bar to facilitate plating is entirely conventional, and its removal after plating is the same. At this point, the parts are ready for cleaning, device bonding or the like.

Various changes in the details, steps, materials, and arrangements of parts, which have been herein described and illustrated in order to explain the nature of the invention, may be made by those skilled in the art within the principle and scope of the invention as defined in the appended claims. Thus, while the invention finds major utility in the production of fine-line conductive patterns on substrates intended for use as semiconductor packages, it can be employed with advantage where fine lines are not required because of the inherent processing economies when compared to conventional methods.

What is claimed is:

1. A method for producing metallized patterns on ceramic bodies comprising:

forming an unfired ceramic body in a desired shape, said shape taking into account shrinkage that will occur on firing;

calcining said body at an elevated temperature sufficient to form a monolithic but porous body, said calcining being insufficient to cause any significant shrinkage;

applying a metallized coating in a desired pattern on said calcined body, said pattern taking into account shrinkage that will occur on firing; and firing said body at an elevated temperature sufficient to fully cure and densify said body, said firing being carried out in a reducing atmosphere.

2. The method as claimed in claim 1, wherein said unfired ceramic body is a pressed compact of a high alumina material, formed about 16 to 22% larger than desired final size.

3. The method as claimed in claim 2, wherein said calcining is carried out at a temperature in the range of 850° to 1200°C., and shrinkage during said calcining is no more than 1%.

4. The method as claimed in claim 1, wherein said metallized pattern is applied by screen printing.

5. The method as claimed in claim 1, and additionally comprising applying a dielectric coating over at least portions of said body and said metallized coating prior to said firing.

6. The method as claimed in claim 5, wherein said dielectric coating is screen printed, and produces a coating of similar composition to said ceramic body after firing.

7. The method as claimed in claim 1, wherein said firing is carried out at a temperature in the range of 1400° to 1700°C.

8. The method as claimed in claim 1, and additionally comprising plating a metal onto at least portions of said metallized coating after said firing.

9. The method as claimed in claim 5, and additionally comprising plating a metal onto portions of said pattern not covered by said dielectric coating after said firing.

10. A method for producing patterns on thick film ceramic substrates as fine as three mils wide with three mil spacing comprising:

forming an unfired ceramic substrate in a desired size and shape, said size taking into account shrinkage that will occur on firing;

calcining said substrate at an elevated temperature sufficient to form a monolithic but porous body, said calcining being of insufficient intensity to cause any significant shrinkage;

screen printing a metallizing paste in a desired pattern on said substrate, said pattern including lines and spaces proportionally larger than desired final size to take into account shrinkage that will occur on firing; and firing said substrate at an elevated temperature sufficient to fully cure and densify said substrate, said firing being carried out in a reducing atmosphere.

11. The method as claimed in claim 10, wherein said unfired ceramic substrate is a pressed compact of a high alumina material, formed about 16 to 22% larger than desired final size.

12. The method as claimed in claim 11, wherein said calcining is carried out at a temperature in the range of 850° to 1200°C. for at least one hour, and shrinkage during said calcining is no more than 1%.

13. The method as claimed in claim 10, and additionally comprising screen printing a dielectric coating over at least portions of said substrate and said pattern prior to said firing, said dielectric coating being adapted to provide a layer of similar composition to said substrate after firing.

14. The method as claimed in claim 10, wherein said firing is carried out at a temperature in the range of 1400° to 1700°C. for at least 5 hours.

15. The method as claimed in claim 10, and additionally comprising plating a metal onto at least portions of said metallized pattern after said firing.

16. The method as claimed in claim 13, and additionally comprising plating a metal onto portions of said pattern not covered by said dielectric coating after said firing.

* * * * *